US011597607B2

(12) United States Patent
Oh et al.

(10) Patent No.: US 11,597,607 B2
(45) Date of Patent: Mar. 7, 2023

(54) AUTOMATED MATERIAL HANDLING SYSTEM HAVING CARRIER POLLUTION MANAGEMENT FUNCTION

(71) Applicant: CANTOPS CO., LTD., Gyeonggi-do (KR)

(72) Inventors: Hak Seo Oh, Gyeonggi-do (KR); Sang Kyo Ahn, Gyeonggi-do (KR); Jin Hwan Ko, Seoul (KR); Sang Gyu Han, Gyeonggi-do (KR); Sung Ik Kim, Gyeonggi-do (KR); Sung Hyuk Youn, Incheon (KR); Jung Kil Park, Gyeonggi-do (KR); Kyung Min Lee, Gyeonggi-do (KR); Se Hun Lee, Gyeonggi-do (KR); Won Ho Kang, Gyeonggi-do (KR); Eun Duk Kim, Gyeonggi-do (KR)

(73) Assignee: CANTOPS CO., LTD., Gyeonggi-Do (KR)

( * ) Notice: Subject to any disclaimer, the term of this patent is extended or adjusted under 35 U.S.C. 154(b) by 307 days.

(21) Appl. No.: 16/868,885

(22) Filed: May 7, 2020

(65) Prior Publication Data
US 2021/0253362 A1    Aug. 19, 2021

(30) Foreign Application Priority Data
Feb. 18, 2020    (KR) .......................... 10-2020-0019695

(51) Int. Cl.
*B65G 43/10*    (2006.01)
(52) U.S. Cl.
CPC ................................... *B65G 43/10* (2013.01)
(58) Field of Classification Search
CPC ..................................................... B65G 43/00
(Continued)

(56) References Cited

U.S. PATENT DOCUMENTS 6,901,971 B2 *    6/2005    Speasl ............... H01L 21/67253
                                                                  414/940
7,419,346 B2 *    9/2008    Danna ............... H01L 21/67772
                                                                  414/217
(Continued)

FOREIGN PATENT DOCUMENTS

| KR | 101565091 | 11/2015 | |
| KR | 1020190051385 | 5/2019 | |
| WO | WO-2014142815 A1 * | 9/2014 | ........... A61B 5/0066 |

OTHER PUBLICATIONS

Adler, Desmond, A Data Collection system and a Data Collection System Controller, Dec. 23, 2015, CN-105188553-A (Year: 2015).*

*Primary Examiner* — Gene O Crawford
*Assistant Examiner* — Lester Rushin, III
(74) *Attorney, Agent, or Firm* — IPLA P.A.

(57) ABSTRACT

An automated material handling system includes: at least one state detecting sensor disposed inside or outside the carrier to detect an internal state of the carrier including a degree of pollution in the carrier; a carrier interface to transmit a carrier state value; a carrier controller including a controller interface disposed on the plate to obtain a carrier state value by communicating with the carrier interface, and a carrier control unit configured to generate carrier management information including the carrier state value obtained through the controller interface and current location information of the carrier and output the carrier management information to a server; and a server configured to analyze an internal pollution state of the carrier based on the carrier management information provided by the carrier controller.

22 Claims, 10 Drawing Sheets

(58) Field of Classification Search
USPC .......................................................... 700/213
See application file for complete search history.

(56) References Cited

U.S. PATENT DOCUMENTS

| | | | |
|---|---|---|---|
| 9,364,086 B2 * | 6/2016 | Takahara | .......... H01L 21/67393 |
| 10,991,606 B2 * | 4/2021 | Fujiwara | ........... H01L 21/67766 |
| 2019/0346067 A1 * | 11/2019 | Buskirk | ............... B41J 2/14282 |

* cited by examiner

FIG. 5

| Page | DATA TYPE |
|---|---|
| N | , |
| , | , |
| , | TILT |
| 4 | HUMIDITY |
| 3 | TEMPERATURE |
| 2 | CARRIER ID : 8 BYTES |
| 1 | CARRIER ID : 8 BYTES |

ND HAVING CARRIER POLLUTION
AUTOMATED MATERIAL HANDLING SYSTEM HAVING CARRIER POLLUTION MANAGEMENT FUNCTION

CROSS REFERENCE

This application claims priority under 35 U.S.C. 119 to Korean Patent Application No. 10-2020-0019695, filed on 18 May 2020, in the Korean Intellectual Property Office, the disclosures of which is herein incorporated by reference in their entireties.

BACKGROUND

The present invention relates to a technology of managing an internal pollution state of a carrier carrying a processing material including a wafer for semiconductors or an LCD substrate in real time at all positions of the automated material handling system to always maintain the inside of the carrier in a clean state, further increasing production efficiency of the processing material conveyed through the carrier.

Generally, in manufacturing processes of a semiconductor element or a liquid crystal display device, the manufacturing goods are transferred to the manufacturing equipment by using an automated material handling system (AMHS), so that the transferred goods are manufactured according to the manufacturing processes of each manufacturing equipment.

Such an automated material handling system utilizes an unmanned transporting device for transferring a carrier with a semiconductor substrate or a liquid crystal substrate to the manufacturing station located on the manufacturing process line and transferring the carrier with the goods completely processed in the corresponding manufacturing equipment to the next manufacturing equipment.

Depending on the movement method, the unmanned transporting device includes an automated guided vehicle (AGV) that drives autonomously through the wheel, a rail guided vehicle (RGV) that drives along the guide rail located at the bottom, and an overhead hoist transport (OHT) that drives along a guide rail installed in the ceiling. These unmanned transporting devices are moved to the corresponding manufacturing equipment by using the wheel, or the bottom rail, or the overhead rail, and it carries the carrier onto or out the manufacturing equipment by using an operating arm or a hoist and a hand.

On the other hand, the semiconductor industry has recently produced a high value-added product on the basis of advanced technology, and the production technology has continuously been developed to secure a competitive edge.

Major semiconductor products already have nano-sized patterns from many years ago, and the main size of the wafer for the production of products is 300 mm.

Accordingly, the demand for securing the efficiency of environmental pollution management in manufacturing processes has been increased. Furthermore, starting from the process of using a 300 mm wafer, a FOUP (Front Opening Unified Pod) is used for wafer transfer or storage between processes. The FOUP (hereinafter referred to as a carrier) has been introduced to prevent defects and to efficiently produce a wafer by maintaining a clean environment for wafer exposure as the wafer size becomes large, and the wafer pattern becomes miniaturized.

However, in the automated material handling system using the FOUP, many chemicals and process gases used in the dozens of processes remain on the wafer and are introduced into the carrier, so that they contaminate the air in the carrier and cause a defect by adsorbing on to the carrier.

In particular, when one carrier is contaminated in the automated material handling system, contamination can occur across all process lines since the carrier moves to various locations and spreads the contamination.

Accordingly, a method of injecting inert gas into the carrier by installing an inert gas supply and exhaust module on a shelf provided to seat the carrier on the equipment has been used. To this end, it is necessary to accurately measure the internal state of the carrier.

Patent Literature 1 and Patent Literature 2 disclose configurations for checking the internal state of the carrier by installing a variety of sensors in the interior of the carrier. At this time, the carrier is provided with a battery therein. The battery supplies power to devices in the carrier such as a sensor and a communication unit.

In the automated material handling system such as Patent Literature 1 and Patent Literature 2, if the battery voltage provided inside the carrier is lowered, it is not possible to obtain the correct internal condition of the carrier since the sensor is not operating normally. However, such error is difficult to check. Also, when the battery reaches the end of its life, there is a hassle for the operator to open the door of the carrier to recharge or replace the battery.

In particular, in an environment in which tens of thousands of carriers are used in a single factory such as a recent semiconductor plant, this battery power supply method has a disadvantage in that it takes a lot of time and cost to manage the carrier. Therefore, there is a big problem in actual application to the semiconductor factory.

Patent Reference 1: Korean Patent Registration No. 10-1565091 (Oct. 27, 2015; Title: Wafer Transfer Apparatus for Monitoring Contamination of Semiconductor Processes)

Patent Reference 2: Korean Patent Publication No. 10-2019-0051385 (May 15, 2019; Title: Device for Testing Leak of Purging Gas at Purging Shelf for Wafer Container)

SUMMARY OF THE INVENTION

The present invention has been made in view of the above circumstances, and a technical object of the present invention is to provide an automated material handling system having a carrier pollution management function, which supplies driving power for an operation of a sensor unit in the carrier for carrying the processing material by a wireless charging method to miniaturize the size of the sensor unit and enable the installation of a plurality of sensor units without limiting the number of processing materials to be stored in the carrier.

Another object of the present invention is to provide an automated material handling system having a carrier pollution management function of managing an internal pollution state of the carrier in real time at all positions of the automated material handling system to always maintain the inside of the carrier in a clean state, further increasing production efficiency of the processing material conveyed through the carrier.

According to an aspect of the invention to achieve the object described above, there is provided an automated material handling system having a function of managing pollution in a carrier, in which a series of processes are performed on a processing material while a carrier containing the processing material is loaded on an unmanned transport vehicle and being moved to at least one processing equipment of a tool buffer, a stocker, and a load port along a rail, each of the processing equipment being provided with a plate for seating the carrier, the automated material handling system including: at least one state detecting sensor disposed inside or outside the carrier to detect an internal state of the carrier including a degree of pollution in the carrier; a carrier interface disposed inside or outside the carrier to transmit a carrier state value obtained from the state detecting sensor by communicating with a carrier controller of a corresponding plate while the carrier is seated on the plate; a carrier controller including a controller interface disposed on the plate to obtain a carrier state value by communicating with the carrier interface, and a carrier control unit configured to generate carrier management information including the carrier state value obtained through the controller interface and current location of the carrier and to output the carrier management information to a server; and a server configured to analyze an internal pollution state of the carrier based on the carrier management information provided through the carrier controller.

In addition, the carrier interface includes an RFID tag, and the controller interface includes an RFID reader to perform RFID communication with each other, wherein the carrier interface includes a smart sensor configured to generate driving power by being charged with an RF signal received from the controller interface through the RFID tag, record a carrier state value received from the state detecting sensor in another storage area of a sensor memory in which a carrier ID is stored in advance, and output tag information including one or more of the carrier ID or the carrier state value stored in the sensor memory through the RFID tag, and wherein the RFID reader outputs an RF signal from the RFID tag of the smart sensor and reads the tag information by communicating with an RFID when the RFID reader is disposed on the plate.

In addition, the plate is connected to gas supply equipment for supplying and discharging $N_2$ gas into and from the carrier, the server generates $N_2$ gas adjustment information based on the degree of pollution in the carrier and transmits the $N_2$ gas adjustment information to a carrier controller of a plate on which the carrier is located, and the carrier controller controls the gas supply equipment connected to the plate based on the $N_2$ gas adjustment information received from the server through a carrier control unit to adjust an $N_2$ gas environment in the carrier.

In addition, the carrier is formed with a material accommodating portion to accommodate a processing material therein, and the smart sensor is disposed in an empty space inside the carrier in which the processing material accommodating portion is formed and is disposed at a location adjacent to an RFID reader antenna disposed on the plate when placed on the plate.

In addition, the smart sensor further includes a measurement sensor configured to detect an internal state of the carrier and stores a carrier state value measured by the measurement sensor in a preset storage area of the sensor memory.

In addition, the smart sensor provides a wireless charging function to the state detecting sensor, and the state detecting sensor is configured to operate using power wirelessly charged through the smart sensor and transmit the carrier state value through wireless communication with the smart sensor In addition, the RFID tag provided in the smart sensor and the RFID reader disposed in the plate perform RFID communication with each other through a tag antenna and a reader antenna, perform data communication and power transmission using the first frequency, and perform power transmission using the second frequency.

In addition, the RFID tag and the RFID reader perform RFID communication using a plurality of tag antennas and a plurality of reader antennas in one-to-one correspondence with the plurality of tag antennas, the first tag antenna and the first reader antenna perform data communication and power transmission, and remaining tag antennas and remaining reader antennas only perform power transmission.

In addition, the carrier controller is disposed on one side of the plate further includes a carrier detecting sensor to output a carrier detection signal when the carrier is seated, and performs communication with the carrier interface based on a carrier detection signal obtained from the carrier detecting sensor.

In addition, the server stores carrier management information including a carrier state value and location information based on a carrier ID and determines when to replace a carrier in which pollution of a predetermined degree or more occurs a predetermined frequency or more and whether to proceed to the next process of the carrier using the carrier management information.

In addition, the carrier control unit collects carrier state information from the carrier interface based on reception of $N_2$ gas adjustment information and controls a supply or discharge of $N_2$ gas based on a current state value of the carrier to control an internal pressure of the carrier at an optimal state.

In addition, when a state detecting sensor is further provided inside the carrier, the server transmits and installs an updated smart sensor operating program to interwork with the added state detecting sensor to each smart sensor through the carrier controller, and the smart sensor communicates with all the state detecting sensors disposed in the carrier according to the updated smart sensor operating program.

In addition, when a program of the carrier controller is improved, the server transmits and installs an updated carrier controller operating program to the carrier controller, and the carrier controller operates according to the updated carrier controller operating program.

In addition, the system further includes a carrier controller in one-to-one correspondence with the plate, and the carrier controller records a unique ID of the carrier controller as carrier location information on the RFID tag of the smart sensor through the RFID reader, receives the tag information including carrier location information that is carrier movement information until the present time from the RFID tag, and transmits the tag information to the server.

In addition, the unmanned transport vehicle includes a controller interface for communicating with the carrier interface disposed in the carrier which is being accommodated and moved, the unmanned transport vehicle generates carrier management information by adding its own unique ID as carrier location information to the tag information received through the controller interface and transmits the carrier management information to the server.

In addition, a carrier control module of the carrier controller is connected to a plurality of plates to generate carrier management information for each carrier including state information and carrier location information for each carrier seated on each plate and transmit the carrier management information to the server, and the carrier location information is a unique ID of a corresponding plate.

BRIEF DESCRIPTION OF THE DRAWINGS

The above and other objects, features, and advantages of the present invention will be more apparent from the following detailed description taken in confluence with the accompanying drawings, in which:

FIG. 5 is a diagram showing an example of a storage area of a sensor memory (124) shown in FIG. 4;

DETAILED DESCRIPTION OF THE PREFERRED EMBODIMENT

Since the description of the present invention is a mere embodiment for structural and functional description, it must not be interpreted that the scope of the present invention is limited by the embodiments described in the text. That is, since the embodiments can be variously changed and have various forms, it should be understood that the scope of the invention includes the equivalents realizing the technical concept. Also, since the specific embodiments do not include all objects and effects presented by the present invention, the scope of the present invention is not limited by them.

Unless differently defined, all the terms used here including technical or scientific terms have the same meaning with what is generally understood by one who has common knowledge in the technical field that this invention belongs to. The terms such as those defined in the dictionary commonly used will be interpreted as the meanings that matches with the meanings in the context of the related technologies. Unless clearly defined in this application, they are not interpreted as ideal or excessively formal meanings.

Figure 1:
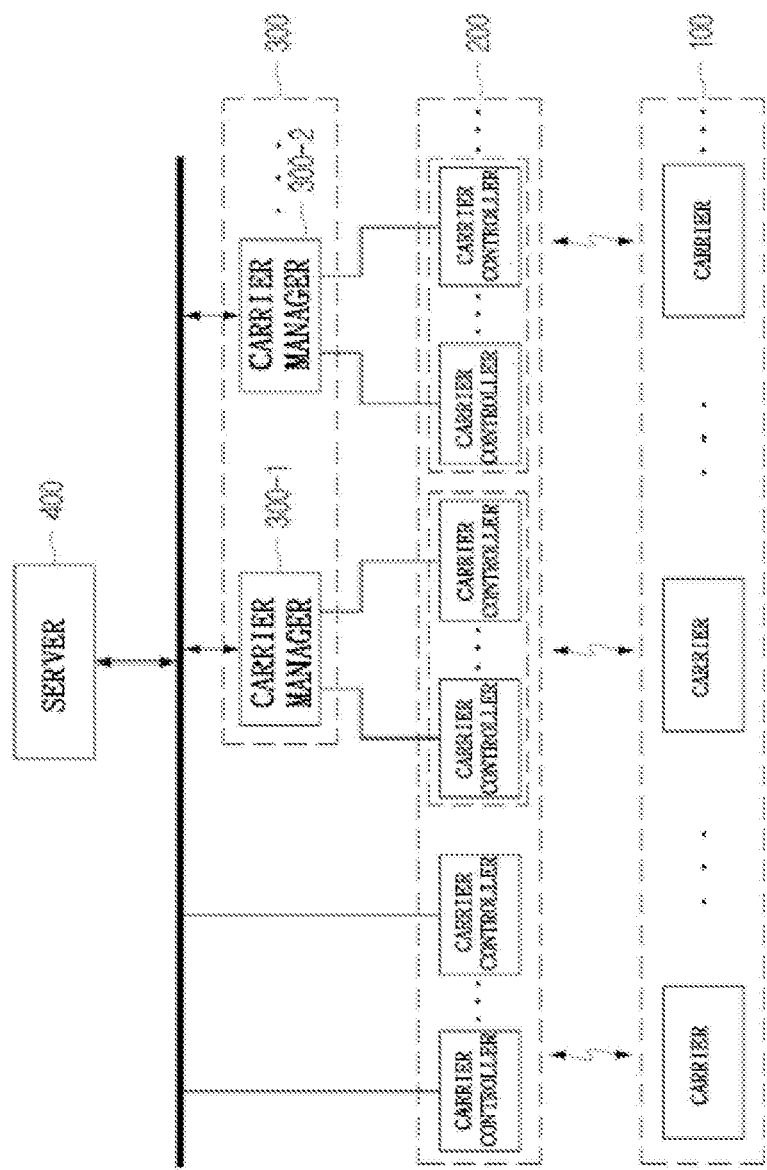
FIG. 1 is a diagram showing a schematic configuration of an automated material handling system having a carrier pollution management function according to a first embodiment of the present invention.

FIG. 1 is a diagram showing a schematic configuration of an automated material handling system having a carrier pollution management function according to a first embodiment of the present invention.

Referring to FIG. 1, an automated material handling system having a carrier pollution management function according to the present invention may include a carrier (100), a carrier controller (200), and a server (400), and may further include a carrier manager (300) between the carrier controller (200) and the server (400) depending on the scale of the automated material handling system. The carrier manager (300) may communicate with a carrier controller group consisting of a plurality of different carrier controllers (200), and a plurality of carrier managers (300) are connected to different carrier controller groups via a server (400). For example, the first carrier manager (300-1) may be connected to the carrier controller (200) of a tool buffer (10, FIG. 2), and the second carrier manager (300-2) may be connected to the carrier controller (200) of a stocker (20, FIG. 2).

Figure 2:
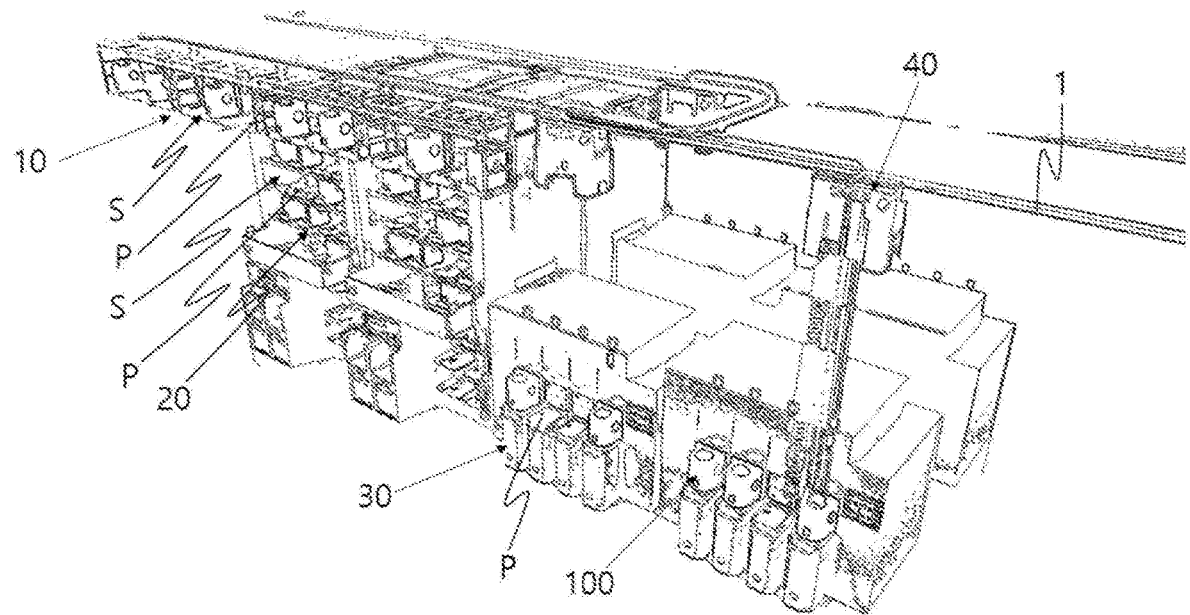
FIG. 2 is a diagram showing an example of an automated material handling system having a processing equipment applied to the present invention.

Generally, the processing equipment constituting the automated material handling system includes a tool buffer (10), a stocker (20), a load port (30), and an unmanned transport vehicle (40) as shown in FIG. 2. The carrier (100) moves through a rail (1) while being loaded on the unmanned transport vehicle (40), thereby changing a process position to the tool buffer (10), the stocker (20), and the load port (30).

The carrier (100) performs a function of transporting a processing material including a wafer for semiconductors or an LCD substrate while blocking an external environment. In the present invention, the carrier (100) includes at least one state detecting sensor generally disposed inside or outside the carrier (100) to detect an internal state including a degree of pollution inside the carrier, and a carrier interface that transmits a carrier state detected by the state detecting sensor to the carrier controller (200) when the carrier (100) is disposed in a process position.

In this case, while being seated on the plate at the process position, the carrier interface may collect measured carrier state values by using wired or wireless communication with the carrier controller (200) disposed on a plate. That is, the carrier interface included in the carrier (100) may include an RFID tag to communicate with the carrier controller (200) by RFID, and charge with power received through the RFID communication with the carrier controller (200) to operate devices included in the carrier and the carrier interface itself.

The carrier controller (200) is provided in processing equipment other than the unmanned transport vehicle (40), that is, each processing equipment including the tool buffer (10), the stocker (20), the load port (30), and others including a device storing FOUPs or processing objects to be conveyed in FIG. 2.

Each processing equipment may include a plate (P) that seats and supports the carrier (100) and is connected to a gas adjusting unit for supplying $N_2$ gas into the carrier (100) or discharging the gas in the carrier (100). In this case, the tool buffer (10) and the stocker (20) are facilities for storing the carrier (100). The tool buffer (10) and the stocker (20) are configured to have a plurality of cells (S) each accommodating one carrier (100) and the plate (P) is disposed in one-to-one correspondence with each cell (S).

In addition, the carrier controller (200) includes a controller interface for communicating with the carrier (100) seated on the plate (P) connected to the carrier controller (200), and transmits a carrier ID and a carrier state value obtained by communicating with the carrier (100) through a controller interface and carrier management information including carrier location information on a location, at which the carrier (100) is seated, to the carrier manager (300) or the server (400), which is the superior system. In this case, the carrier location information may be a unique ID of equipment or a cell in which the plate (P) is located or a unique ID of the plate. The controller interface may include a wired or wireless communication module corresponding to the carrier interface. Preferably, the controller interface may be an RFID reader that reads out tag information obtained from the carrier (100) by performing RFID communication.

In addition, the carrier controller (200) and the carrier manager (300) may perform communication using a field bus including EtherCAT (Ethernet for Control Automation Technology), which is an industrial Ethernet, and the carrier manager (300) may be connected to the server (400) through LAN.

In addition, the carrier controller (200) may control the gas supply equipment connected to the plate (P) in response to a request from the superior system (the carrier manager or the server) to perform operation of supplying $N_2$ gas into the carrier (100) or discharging the gas from inside the carrier (100).

At least one carrier manager (300) is provided for each automatic conveying equipment and communicates with a plurality of carrier controllers (200) located in the automatic conveying equipment under its control. The carrier manager (300) transmits carrier management information received from the carrier controller (200) to the server (400), which is the superior system, and transmits $N_2$ adjustment information received from the server (400) to the corresponding carrier controller (200). In this case, the carrier manager (300) adds its own ID to the carrier management information and transmits the information to the server (400).

The server (400) stores the carrier management information in data storage to include a carrier state value and location information for each carrier ID by rearranging the carrier management information received from the carrier controller (200) or the carrier manager (300) based on carrier IDs, and performs pollution management of the carrier based on the carrier management information. In this case, the data storage stores the location information of the processing equipment constituting the automated material handling system and the various information for the pollution management including a gas supply amount and a gas discharge amount according to a carrier pollution level.

For example, the server (400) may determine an $N_2$ supply amount or an internal gas discharge amount according to a carrier state. In addition, the server (400) generates pollution analysis information including pollution occurrence frequency and pollution occurrence location based on stored accumulative state values of each carrier, for example, internal temperature, humidity, and particle information, and determines when to replace a carrier which pollution of a predetermined degree or more occurs in a predetermined frequency or more and whether to proceed the next process for the corresponding carrier. In particular, by stopping a carrier with a predetermined pollution value or more proceeding to the next process, it is possible to prevent the pollutants from entering other processing equipment and carriers.

Hereinafter, a description will be given with respect to a configuration in which the carrier (100) and the carrier controller (200) perform RFID communication.

Figure 3:
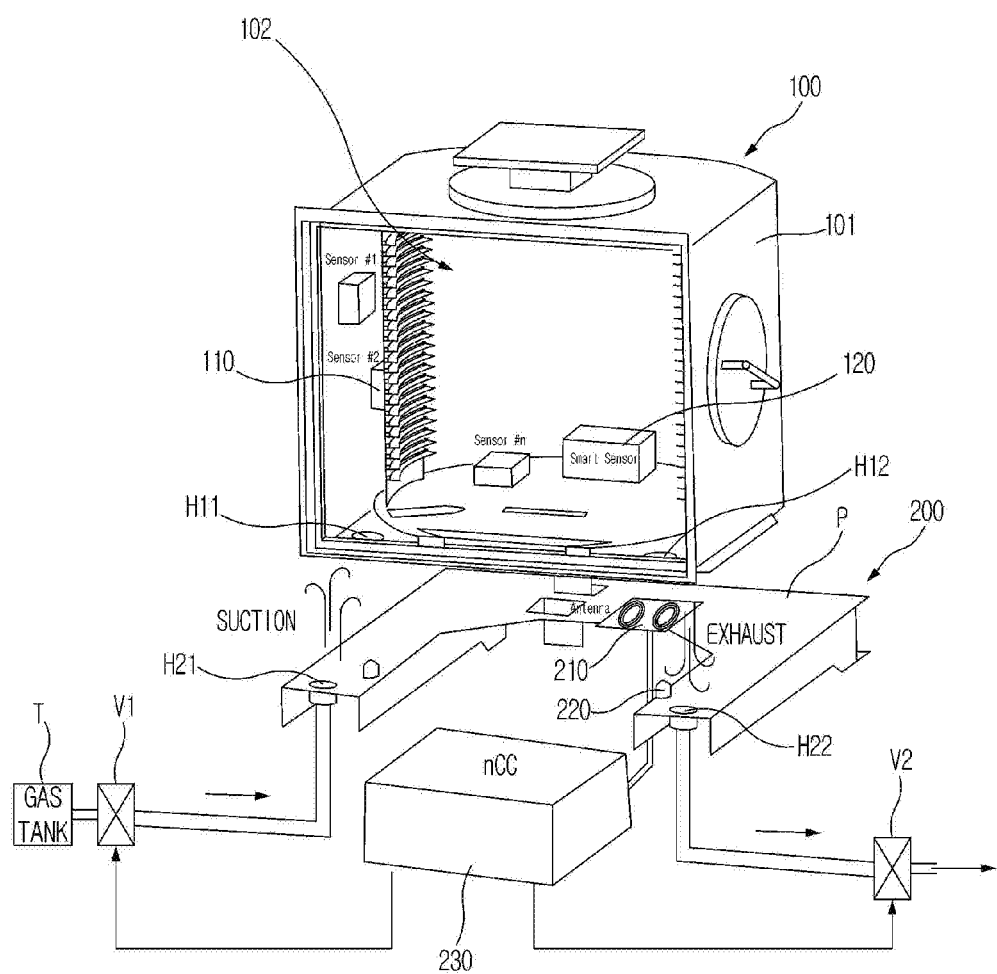
FIG. 3 is a view describing the structures of the carrier (100) and the carrier controller (200) shown in FIGS. 1 and 2.

FIG. 3 is a view for describing the structures of the carrier (100) and the carrier controller (200) shown in FIGS. 1 and 2.

Referring to FIG. 3, the carrier (100) performs RFID communication with the carrier controller (200) in a state of being seated on the plate P.

The carrier (100) is famed with a wafer accommodating portion (102) for accommodating a processing material, such as, a wafer, in a body (101), and a sensor unit including at least one state detecting sensor (sensor #1, sensor #2, sensor #n) (110) and a carrier interface (hereinafter, the smart sensor (120)) is provided in an empty space around the wafer accommodating portion (102). In this case, the smart sensor (120) is also provided with a measurement sensor for detecting a state. In some cases, when it is necessary to install the state detecting sensor (110) at a specific position, the state detecting sensor (110) may be additionally disposed inside or outside the carrier (100).

The state detecting sensor (110) may detect an internal state of the carrier (100) and may include at least one sensor—a temperature sensor, a humidity sensor, an acceleration sensor, a particle sensor, and a tilt sensor. In this case, each state detecting sensor (110) generates driving power from power wirelessly charged from the smart sensor (120) and performs a unique state detecting operation with the power. The state detecting sensor (110) may include a wireless transmission and reception module for wireless communication with the smart sensor (120), a power module for performing a wireless charging function in conjunction with the smart sensor (120) and converting the charged power into the operating power, a measurement module for performing a unique sensing function for detecting an internal state of the carrier, and a memory for storing information of an operation algorithm including a corresponding sensor ID. In the present invention, the state detecting sensor (110) may be connected to the smart sensor (120) by wires.

The smart sensor (120) is disposed on a bottom surface inside the body (101), and preferably disposed to face a position close to a reader antenna of the RFID reader (210) disposed on the plate (P).

The smart sensor (120) is charged with power by using an RF signal received from the reader antenna of the RFID reader (210), and supplies the charged power to the smart sensor (120) itself and the state detecting sensor (110) as the driving power.

In addition, the smart sensor (120) records a carrier state value received from a measurement module (126, FIG. 4) in the smart sensor (120) or the state detecting sensors (110) in a predetermined memory area of the RFID tag, and wirelessly transmit the tag information including a carrier state value to the carrier controller (200).

Meanwhile, the carrier controller (200) includes the RFID reader (210), the carrier detecting sensor (220), and a carrier control unit (230). In this case, the RFID reader (210), more specifically, the RFID reader (210), the reader antenna (211, FIG. 6) and the carrier detecting sensor (220) are disposed on the plate (P) and the carrier control unit (230) that controls the overall operation of the carrier controller (200) is electrically connected to the reader antenna (211) and the carrier detecting sensor (220).

In this case, the plate (P) is formed with a suction port (H21) communicating with the carrier (100) when the carrier (100) is seated to supply $N_2$ gas to the inside of the carrier (100), and an exhaust port (H22) for exhausting gas inside the carrier (100) to the outside. That is, a suction port (H11) is formed at one side of the carrier (100) corresponding to the suction port (H21), and an exhaust port (H12) is formed at the other side of the carrier (100) corresponding to the exhaust port (H22). The number of such suction ports and exhaust ports may be formed in various combinations. For example, one suction port and one exhaust port may be formed, or three suction ports and one exhaust port may be provided.

The suction port (H21) is connected to a gas tank (T) filled with $N_2$ gas and a supply valve (V1) through a first pipe, and the exhaust port (H22) is connected to a discharge valve (V2) through a second pipe. Accordingly, the carrier controller (200) adjusts the supply valve (V1) and the discharge valve (V2) to supply N₂ gas into the carrier (100) or discharge polluted gas existing in the carrier (100) to the outside, such that the inside of the carrier (100) remains in a clean state.

Figure 4:
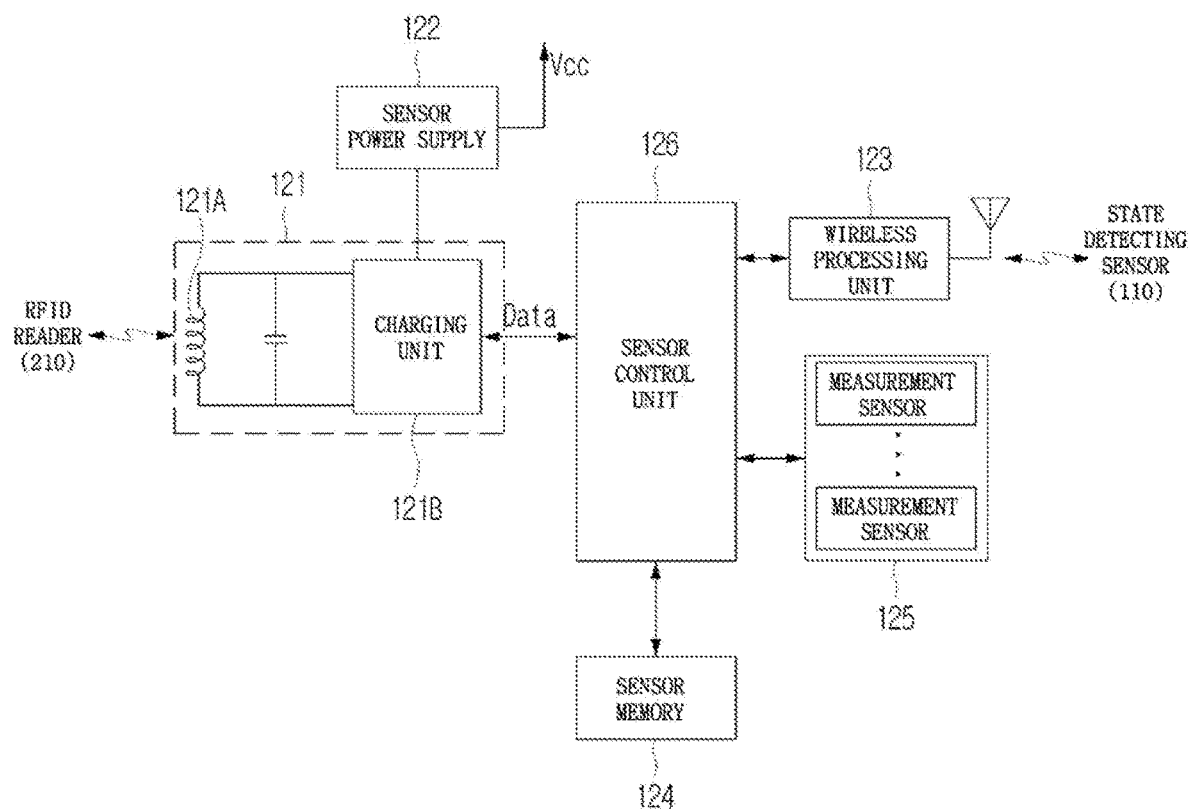
FIG. 4 is a block configuration diagram that functionally separates and describes internal components of the smart sensor (120) shown in FIG. 3.

FIG. 4 is a block configuration diagram for functionally separating and describing internal components of the smart sensor (120) shown in FIG. 3.

Referring to FIG. 4, the smart sensor (120) includes a tag antenna (121A), an RFID tag (121) including a charging unit (121B), a sensor power supply (122), a wireless processing unit (123), a sensor memory (124), a measurement sensor (125), and a sensor control unit (126).

The RFID tag (121) is charged with the RF signal received from the RFID reader (210) through the tag antenna (121A) using the charging unit (121B) to use as power, and wirelessly transmits ID information and state values stored in the memory (124) through the tag antenna (121A) using the charged power. In this case, the RFID tag (121) is connected to the sensor control unit (126) through a data line which branches out from the charging unit (121B).

The sensor power supply (122) converts the power obtained through the RFID tag (121) into DC power and supplies the power to the smart sensor (120) and the state detecting sensor (110) as driving power. In this case, the sensor power supply (122) may further include a rechargeable battery for storing power acquired through the RFID tag 121.

The wireless processing unit (123) collects a carrier state value by performing low power wireless communication with the state detecting sensor 110. In this case, the wireless processing unit (123) and the state detecting sensors (110) may also be configured to perform RFID communication, so that the state detecting sensor (110) may be configured to receive driving power without a separate battery.

The sensor memory (124) basically stores a carrier ID fixedly in a predetermined storage area which is preset and additionally stores a carrier state value in another storage area in which the carrier ID is not stored. For example, as illustrated in FIG. 5, the sensor memory (124) may be previously divided such that 1 and 2 pages are allocated as a carrier ID storage area, and pages 3 to N are allocated as a state information storage area corresponding to the state detecting sensor. For example, the page 3 may be set to an area in which a temperature sensor value is recorded, the page 4 may be set to an area in which a humidity sensor value is recorded, and the page 5 may be set to an area in which a tilt sensor value is recorded. In addition, the sensor memory (124) may be additionally divided such that a location information area for storing location information of the carrier is allocated. In this case, the location information recorded in the location information area may be recorded through the carrier controller (200). The carrier location information stored in the location information area is information corresponding to a movement path of the carrier, and information corresponding to the current carrier location from the previous carrier location may be accumulated and stored.

In addition, the sensor memory (124) is divided such that a storage area for storing information related to an operation of the smart sensor (120) is allocated, and the storage area stores various carrier-related information until a process is completed, including the operation program of the smart sensor, the movement path of the carrier (100), continuous environment information, a time when an abnormal environment occurs and abnormal information. In this case, information related to the operation of the smart sensor (120) may be stored in a separate memory.

The measurement sensor (125) measures the state of the carrier (100) like the state detecting sensor (110) described above.

The sensor control unit (126) records each carrier state value for each of the state detecting sensor (110) and the measurement sensor (125) in a pre-allocated state information storage area of the sensor memory (124). In this case, the sensor control unit (126) overwrites the carrier state value in the corresponding state information storage area, thereby always providing the latest state value of the carrier to the carrier controller (200).

Figure 6:
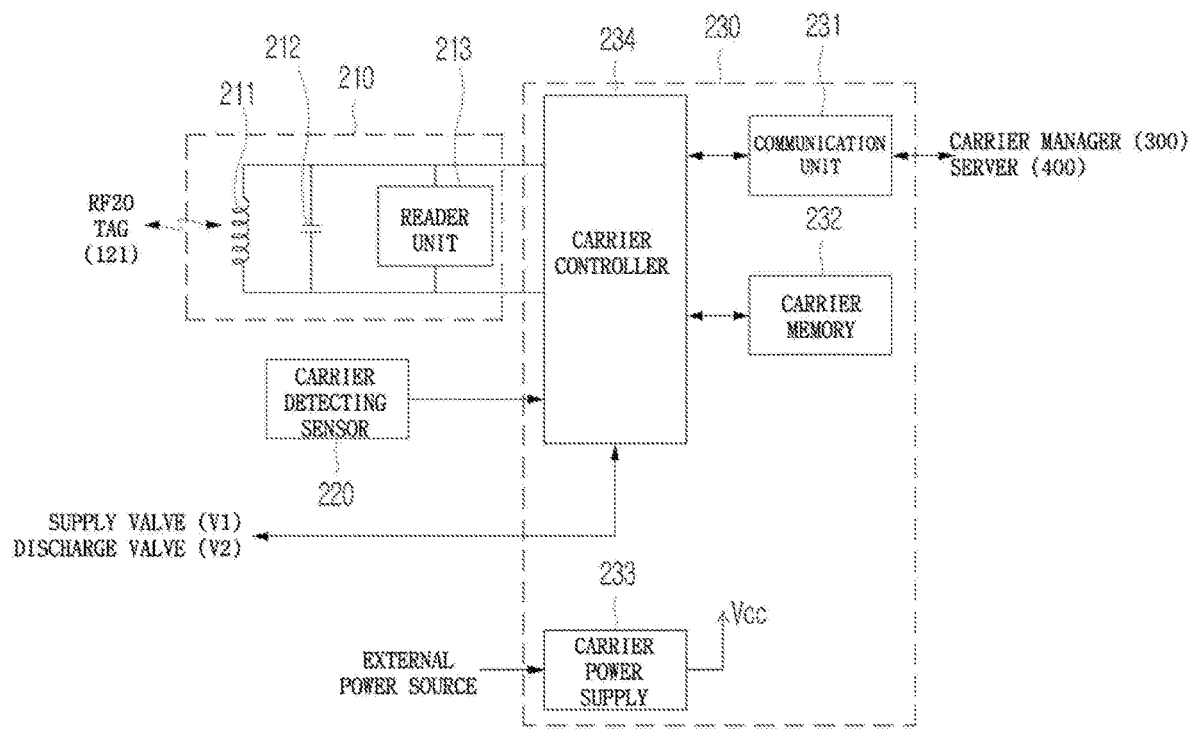
FIG. 6 is a block configuration diagram functionally separating and showing the internal components of the carrier controller (200) shown in FIG. 3.

FIG. 6 is a block configuration diagram functionally separating and showing the internal components of the carrier controller (200) shown in FIG. 3.

Referring to FIG. 6, the carrier controller (200) includes a reader antenna (211), a charging element (212), an RFID reader (210) including a reader unit (213), a carrier detecting sensor (220), and a carrier control unit (230).

The reader antenna (211) of the RFID reader (210) is disposed on the upper surface of the plate (P), wirelessly transmits an RF signal to the RFID tag (121) through the reader antenna (211), and reads out the carrier state information received from the RFID tag (121) interworking with the reader antenna (211) through the reader unit (213).

The carrier detecting sensor (220) determines whether the carrier (100) is seated on the plate (P) while being positioned on one side of the plate (P), and outputs a carrier detection signal when the carrier (100) is seated.

The carrier control unit (230) is a device that performs overall operation of the carrier controller (200), and includes a communication unit (231), a carrier memory (232), a carrier power supply (233), and a carrier controller (234).

The communication unit (231) transmits and receives information related to carrier pollution management to and from the carrier manager (300) or the server (400). In this case, the communication unit (231) includes a communication module capable of performing communication in a daisy chain or ring structure, for example, an EtherCAT module, to perform real-time communication with the carrier control unit (230) and the carrier manager (300) adjacent thereto and may further include one or more of a wireless communication module or a serial communication module.

Here, the wireless communication module transmits and receives I/O signals is a communication method including E84 or E23 which is used as a semiconductor standard when a carrier storage device, such as the tool buffer (10) or the stocker (20), and an unmanned transport vehicle (40) exchange a carrier with each other. In addition, when a wireless sensor module is provided in the smart sensor 120, the state information of the carrier is received from the wireless communication module of the smart sensor (120) of the carrier (100) located in the load port 30 and data may be wirelessly transmitted to the carrier manager (300) or the server (400), which is the superior system. For example, the wireless communication module may use a WiFi band of 2 GHz or 5 GHz band.

In addition, the serial communication module transmits data to the carrier manager (300) or the server (400), which is the superior system, through various types of serial communication methods including Ethernet.

In addition, the daisy chain communication module communicates with the carrier manager (300) or the server (400) by connecting cells of a predetermined number or more to the ceiling with a daisy chain using a single communication line in a system in which the number of cells (S) for storing the carriers (100) is larger than or equal to the predetermined number, such as the tool buffer (10) or the stocker 20. This is a result of consideration of the inconvenience that it is difficult to install communication lines on the ceiling as there are too many communication lines in the structure of connecting cells (S) of a predetermined number or more in a general star connection method.

The carrier memory (232) stores various types of information for reporting carrier state information including location information of the plate (P) and managing carrier pollution.

The carrier power supply (233) receives AC or DC power from the outside to generate DC power for use in the carrier controller (200).

When a carrier detection signal is received from the carrier detecting sensor (220), the carrier controller (234) collects carrier state information through the RFID reader (210), generates carrier management information by adding the current location information of the carrier to the carrier state information, and transmits the carrier management information to the superior system through the communication unit (231). In this case, the carrier controller (234) may collect previous location information of the carrier, which is previous movement information of the corresponding carrier stored in the sensor memory 124, generate tag information additionally including the previous location information, and transmit the tag information to the upper system.

In addition, the carrier controller (234) controls the supply valve (V1) or the discharge valve (V2) connected to the plate (P) based on the carrier gas adjustment information applied from the superior system, thereby setting the gas environment inside the carrier (100) to a clean state.

In this case, the carrier controller (234) collects the state information of the carrier in real time, and supplies or discharges $N_2$ gas while maintaining a constant pressure based on the carrier state information. Then, the carrier controller (234) determines whether the door (not shown) of the carrier (100) is completely sealed to the body (101) by analyzing the increase amount in pressure in accordance with the gas supply amount, and reports the sealed state of the door to the superior system. In addition, the carrier controller (234) recognizes the seating angle of the carrier (100) based on a tilt value, and when the carrier (100) is incorrectly placed on the plate (P) at an angle out of a predetermined tilt value, the carrier controller reports to the superior system to request change of a location of the carrier (100). The reason for this is to avoid the possibility that, when the unmanned transport vehicle (40) tries to grab the carrier (100) for movement to another location in a state where the carrier (100) is incorrectly placed on the plate (P), the carrier (100) is damaged due to an error in a holding position, which adversely affects operation of lines.

Figure 7A:
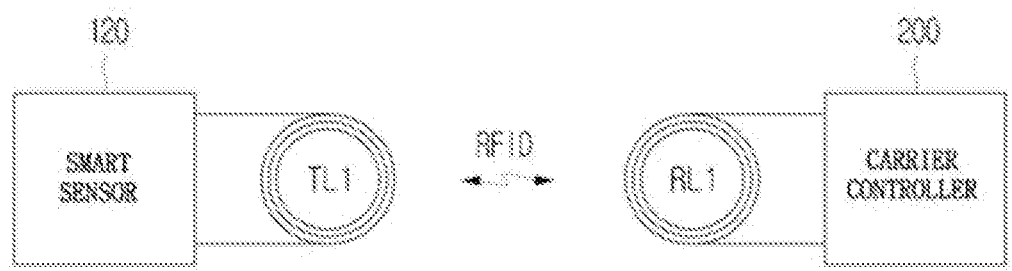
FIGS. 7A and 7B are views each describing an RFID communication structure between a smart sensor (120) and a carrier controller (200)

Meanwhile, in the present invention, an RFID communication structure between the smart sensor (120) and the carrier controller (200) provided in the carrier (100) is basically configured to perform RFID communication through one first tag antenna (TL1) provided in the smart sensor (120) and one first reader antenna (RL1) provided on the plate (P) as shown in FIG. 7A. In this case, in order to perform charging operation with more power through the first tag antenna (TL1), RF power transmission is continuously performed for sections other than a section for data transmission and reception.

However, when one first tag antenna (TL1) and the first reader antenna (RL1) continuously perform data communication and charging operations through RFID communication using one frequency, an error may occur due to frequency interference when an adjacent RFID reader (210) performs data communication with the smart sensor (120).

In order to prevent this, by using a first frequency band in data communication and using a second frequency band in power transmission in the structure of FIG. 7A, RFID communication is continuously performed, thus enabling charging with sufficient power while solving the problem of frequency interference in data communication. In this case, data communication and power transmission may be performed through the first frequency band.

In addition, the present invention may include a plurality of tag antennas and a plurality of reader antennas corresponding to the tag antennas one-to-one to enable the smart sensor (120) and the carrier controller (200) to perform RFID communication.

Figure 7B:
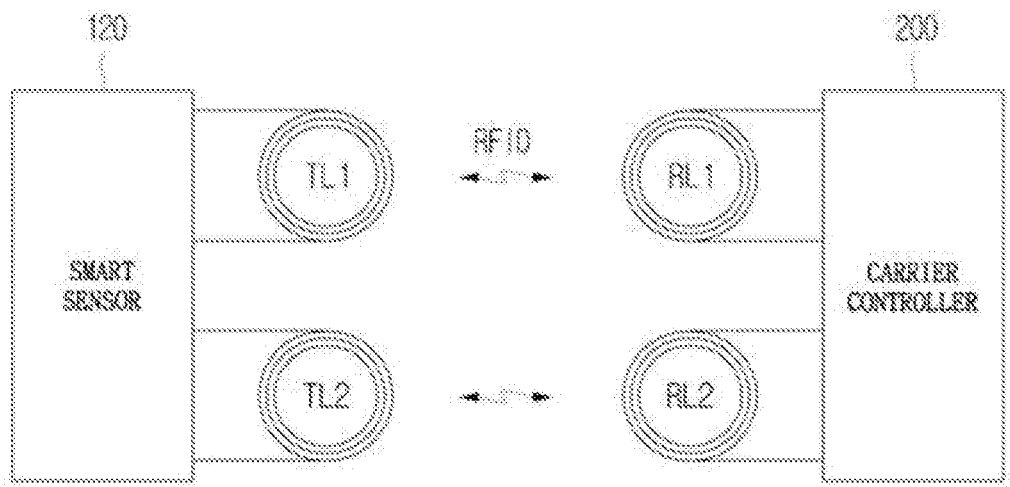

That is, the configuration of the first and second tag antennas (TL1 and TL2) and the first and second reader antennas (RL1 and RL2) are illustrated in FIG. 7B. In this case, one first tag antenna (TL1) and the first reader antenna (RL1) may perform data communication and power transmission using the first frequency band, and at least one second tag antenna (TL2) and the second reader antenna (RL2) may only perform power transmission by using the second frequency band which is different from the first frequency band. Accordingly, the smart sensor (120) may be charged with more power while the carrier (100) is seated on the plate (P).

In addition, the RFID communication using the second frequency band in the structure of FIG. 7A or 7B may be additionally used when a large amount of power is required.

Figure 8:
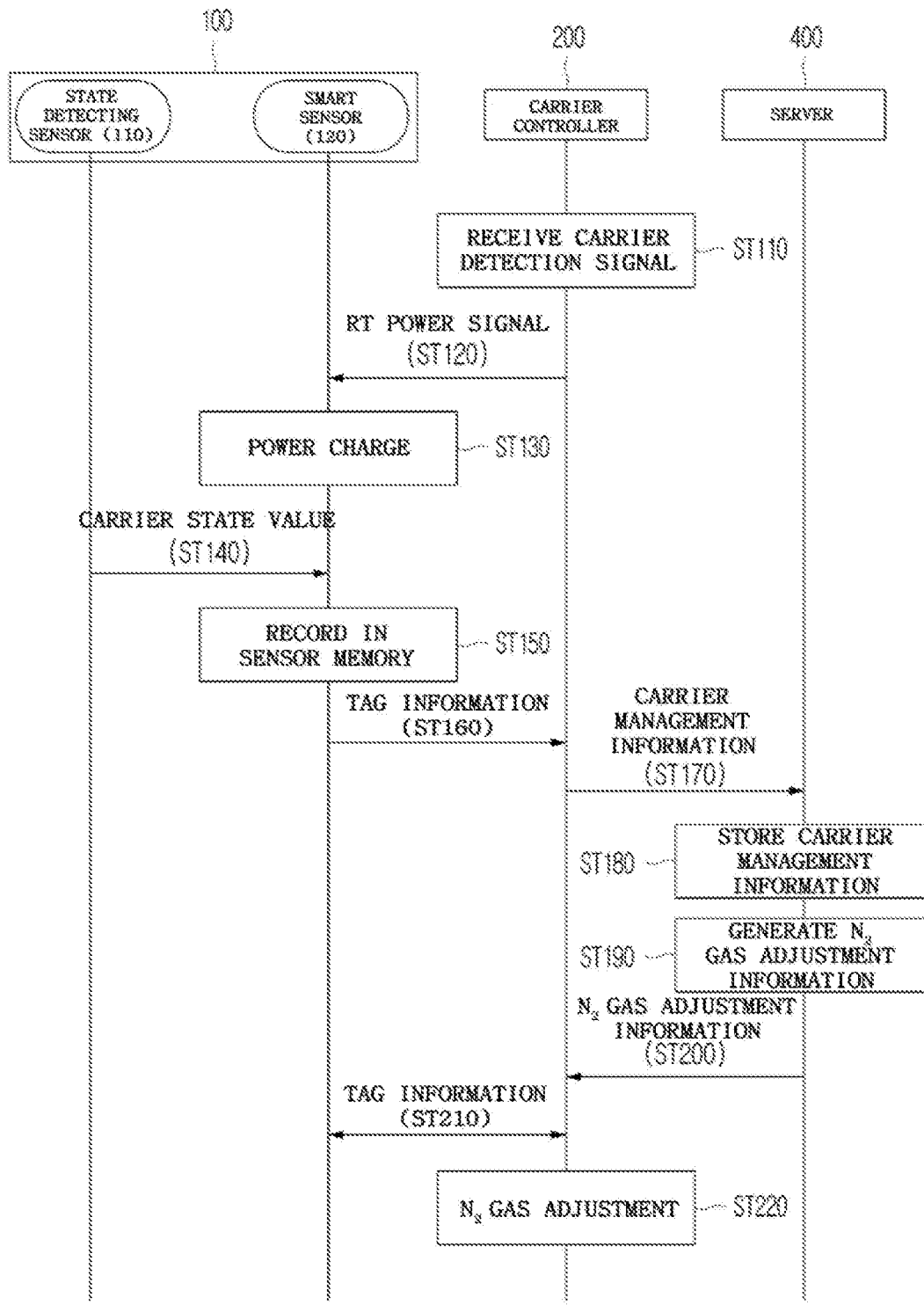
FIG. 8 is a view for describing an operation of the automated material handling system having a carrier pollution management function shown in FIG. 1.

Next, the operation of the automated material handling system having a carrier pollution management function as configured described above will be described with reference to FIG. 8. Hereinafter, a description will be given using a structure in which the carrier controller (200) directly communicates with the server (400), and of course, the carrier controller (200) and the server (400) may communicate with each other through the carrier manager (300) although not shown.

First, when the carrier (100) on which processing material is seated moves along a rail (1) through the unmanned transport vehicle (40) and is then located at one processing equipment of each cell (S) of the tool buffer (10) and the stocker (20) and the load port 40, a carrier detection signal is output through the carrier detecting sensor (220) disposed on the plate (P) on which the carrier (100) is seated, and the carrier control unit (230) receives the carrier detection signal (ST110).

The carrier control unit (230) wirelessly transmits an RF power signal through the RFID reader (210) disposed on the plate (P) on which the carrier (100) is seated (ST120).

The RF power signal output through the RFID reader (210) is applied to the smart sensor (120) in the carrier (100) seated on the corresponding plate P, more specifically, to the RFID tag (121), and the smart sensor (120) is charged with RF power received through the RFID tag (121) (SR130).

In addition, the smart sensor (120) operates the measurement sensor (125) in the smart sensor (120) using the charged RF power or wirelessly charges the state detecting sensor (110) disposed in the internal space of the carrier (100). That is, the smart sensor (120) operates a sensor for obtaining a carrier state value. The state detecting sensor (110) outside the smart sensor (120) uses power wirelessly charged through the smart sensor 120 as its driving power, and wirelessly transmits the detected carrier state value to the smart sensor (120) together with the sensor ID of the smart sensor (120) (ST140). In this case, the measurement sensor 125 in the smart sensor (120) also directly acquires the carrier state value.

The smart sensor (120) records a carrier state value received from the measurement sensor (125) in the smart sensor (120) and the state detecting sensor (110) in the smart sensor (120) as tag information in the sensor memory (124) and records a state value of each sensor in a preset storage area (ST150). In addition, in response to the RFID command received from the carrier controller (200), for example, a command for reading a specific state value or an ID, the smart sensor (120) transmits tag information including carrier state information and carrier location information to the carrier controller (200) via the RFID tag (1212) as a response for the RFID command (ST160). Here, the carrier state information includes at least one of a carrier ID or a carrier state value.

The above-described operations of ST120, ST150 and ST160 are repeatedly performed while the carrier (100) is seated on the plate (P).

On the other hand, the carrier controller (200) reads the tag information received through the RFID reader (210), and transmits the read carrier management info lotion to the superior system (ST170).

The server (400) stores carrier management information in data storage (ST180). In this case, the server (400) may store the carrier location and the carrier state value based on the carrier ID, and further store a reception time.

In addition, the server (400) analyzes a current internal pollution state of the carrier (100) based on the carrier state value of the carrier (100) and generates $N_2$ gas adjustment information based on the analysis result (ST190). For example, the server (400) determines whether to adjust the $N_2$ gas based on a particle state value, and determines an $N_2$ gas supply amount or an $N_2$ gas discharge amount based on the particle state value, a temperature value, and a humidity value. The $N_2$ gas adjustment information includes at least one of the $N_2$ gas supply amount or the $N_2$ gas discharge amount to maintain an optimal state for an internal environment (temperature, humidity, particles, etc.) of the carrier, and the server (400) transmits the $N_2$ gas adjustment information to the carrier controller (200) that manages a plate (P) at a position where the carrier (100) is seated (ST200).

When the $N_2$ gas adjustment information is received from the server (400), the carrier controller (200) performs RFID communication with the carrier (100) to receive tag information from the carrier (100), and reads the tag information to obtain a current carrier state value of the carrier (100) (ST210).

Then, the carrier controller (200) determines an $N_2$ gas adjustment flow based on the current carrier state value, and controls the $N_2$ supply valve or the $N_2$ discharge valve connected to the plate (P) on which the carrier (100) is seated based on the $N_2$ gas adjustment flow to set the internal environment of the carrier (100) to an optimal state (ST220). For example, $N_2$ gas supply or $N_2$ gas discharge may be performed to maintain a constant pressure value.

In this case, when the desired $N_2$ gas adjustment is completed, the carrier controller (200) may receive the current carrier state information from the smart sensor (120) through RFID communication, generates carrier management information, and transmit the carrier management information to the server (400).

On the other hand, when the carrier (100) moves from a current plate location by a preset processing flow of the automated material handling system, the carrier detecting sensor (220) disposed on the corresponding plate (P) is turned off (OFF), and the carrier control unit (230) may generate carrier movement information including a carrier movement state and plate location information and transmit the generated carrier movement information to the server (400).

The server (400) stores the carrier movement information received from the carrier controller (200) in data storage. The server (400) may manage a current location and movement state for each carrier operating in the automated material handling system.

In this case, according to the present invention, the unmanned transport vehicle (40) may be configured to include an RFID reader for performing RFID communication with the smart sensor (120) disposed inside the carrier which is currently being accommodated and moved in the unmanned transport vehicle (40) that moves the carrier (100), generate carrier management information by adding its own ID as carrier location information to the tag information received through the RFID reader, and then wirelessly transmit the carrier management information to the server. Accordingly, the server (400) may monitor the internal state of the carrier even while moving along the rail (1) using the carrier management information received from the unmanned transport vehicle 40.

Figure 9:
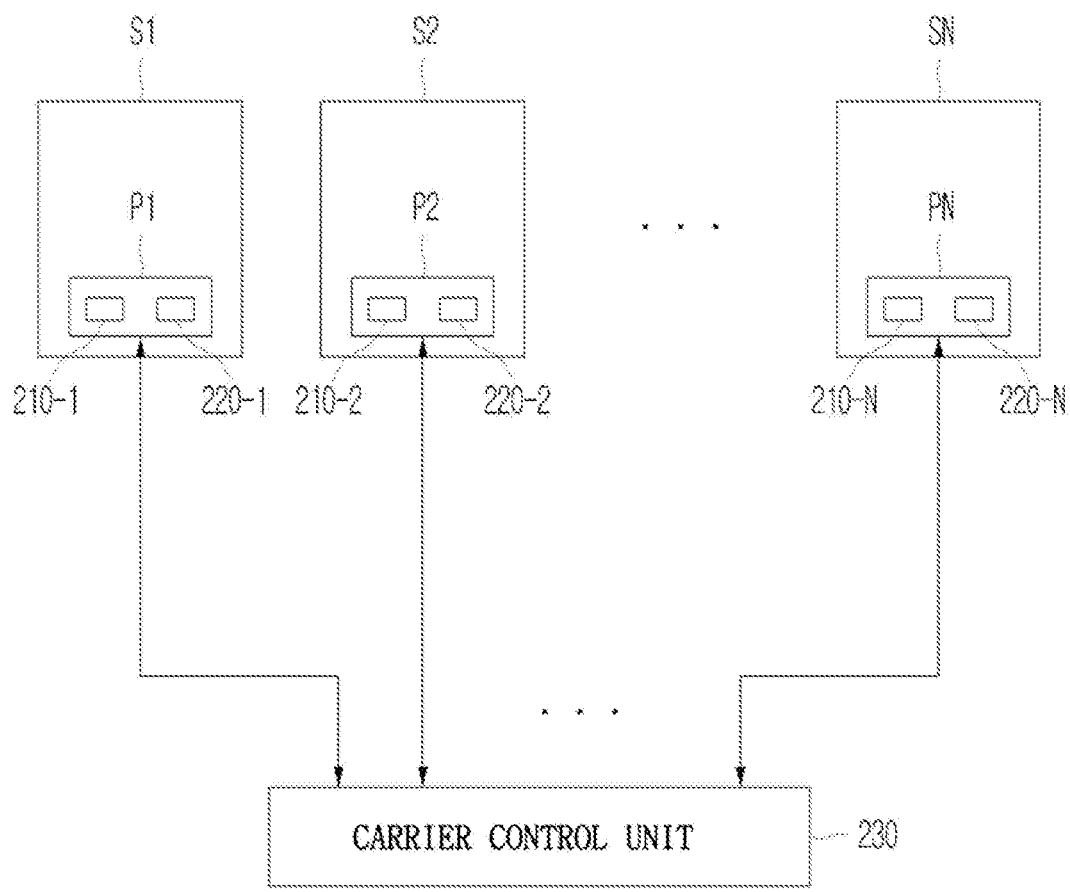
FIG. 9 is a diagram showing a schematic configuration of an automated material handling system having a carrier pollution management function according to a second embodiment of the present invention.

On the other hand, as another embodiment of the present invention, the automated material handling system having a function of managing pollution in the carrier according to the present invention may be configured in a structure in which a plurality of plates (P) is connected to one carrier controller (200). FIG. 9 illustrates a structure in which four plates (P) are connected to one carrier controller (200).

Referring to FIG. 9, an RFID reader (210-1, 210-2, . . . or 210-N) and a carrier detecting sensor (220-1, 220-2, . . . or 220-N) are disposed in each plate (P1 to P4) positioned in each cell (S1 to S4). In addition, the carrier control unit (230) is individually connected to the RFID reader (210-1, 210-2, . . . or 210-N) and the carrier detecting sensor (220-1, 220-2, . . . or 220-N) of each plate (P1 to P4). In this case, the carrier control unit (230) is connected to the reader antenna of each RFID reader.

Figure 10:
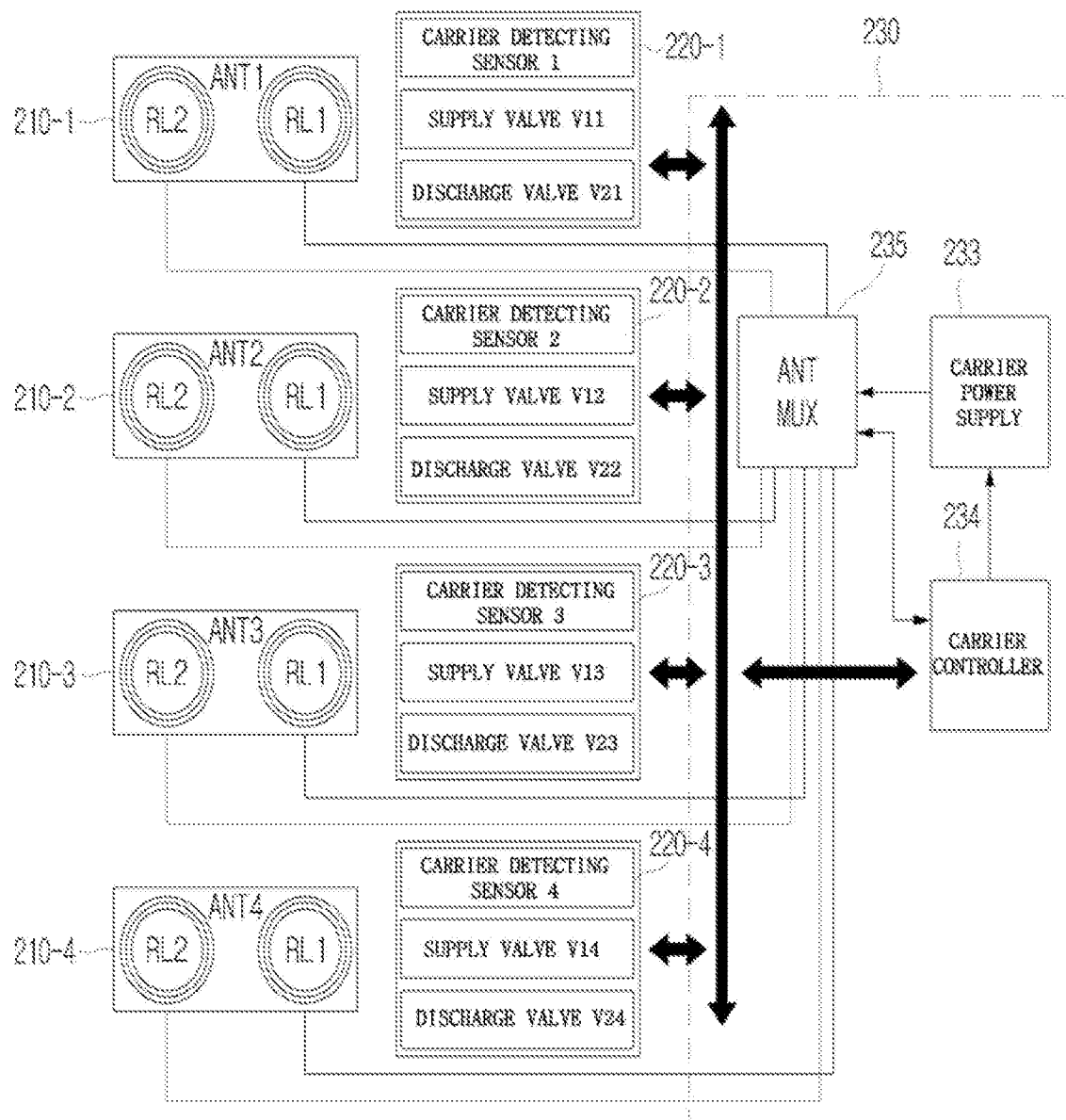
FIG. 10 is a view for describing the internal configuration of a carrier control unit (230) shown in FIG. 9.

As shown in FIG. 10, the carrier control unit (230) may further include a multiplexer (ANT MUX, 235) connected to reader antennas (ANT1, ANT2, ANT3, and ANT4) of the RFID readers (210-1 to 210-4) respectively provided in the first to fourth plates (P1 to P4) which are under the control of the carrier control unit (230). In this case, the multiplexer (235) is provided with a reader unit (213) (FIG. 6).

In addition, the carrier detecting sensor (220) provided in each of the first to fourth plates (P1 to P4) is connected to the carrier controller (234) through an internal bus, and a supply valve (V1) and a discharge valve (V2) disposed in each plate (P) are also connected to the carrier controller (234) through an internal bus.

That is, the carrier control unit (230) generates carrier management information for each carrier including state information of the carrier seated on each plate and a unique ID of the corresponding plate as carrier location information, and transmits the carrier management information to the server (400). Furthermore, the carrier control unit (230) performs an $N_2$ gas adjustment process for the corresponding plate (P) based on the plate unique ID included in the $N_2$ gas adjustment information received from the server (400).

In addition, in the present invention, the carrier (100) may be further provided with a state detecting sensor for detecting a state of the carrier. In this case, the server (400) transmits and installs a smart sensor operating program updated to interwork with the added state detecting sensor (110) to each smart sensor (120) through the carrier controller (200), and the smart sensor (120) supplies power to all the state detecting sensors (110) disposed in the carrier (100) and records state values received from the state detecting sensor (110) in a preset storage area of the sensor memory, according to the updated smart sensor operating program.

In addition, when a program of the carrier controller (200) is improved, the server (400) transmits and installs an updated carrier controller operating program to the carrier controller, and the carrier controller (200) operates according to the updated carrier controller operating program.

According to the present invention, it is possible to monitor the internal state of the carrier on all process lines, efficiently control the internal gas environment of the carrier based on the internal state value of the carrier, and determine whether to proceed to the subsequent process according to the degree of internal pollution of the carrier, thus operating the automated material handling system while always maintaining the processing environment of the processing material in a clean state. As a result, the automated material handling system makes it possible to further improve the quality and productivity of the processing material on which processes have been performed.

In addition, by supplying power in a non-contact manner to the sensor unit provided inside the carrier to minimize the space of the device for detecting the internal state of the carrier, the internal state of the carrier can be easily monitored without limiting the number of processing materials received through the conventional carrier.

In addition, when a sensor for detecting a carrier state is added, the degree of freedom of sensor extension can be improved by updating a program for interworking the sensor added in a wireless manner.

While the present invention has been described with respect to the specific embodiments, it will be apparent to those skilled in the art that various changes and modifications may be made without departing from the spirit and scope of the invention as defined in the following claims.

What is claimed is:

1. An automated material handling system having a function of managing pollution in a carrier, in which a series of processes are performed on a processing material while a carrier in which the processing material is accommodated is being moved to at least one processing equipment of a tool buffer, a stocker, and a load buffer along a rail in a state of being loaded on an unmanned transport vehicle, each of the processing equipment being provided with a plate for seating the carrier, the automated material handling system comprising:
   at least one state detecting sensor disposed inside or outside the carrier to detect an internal state of the carrier including a degree of pollution in the carrier;
   a carrier interface disposed inside or outside the carrier to transmit a carrier state value obtained from the state detecting sensor by communicating with a carrier controller of a corresponding plate while the carrier is seated on the plate;
   a carrier controller including a controller interface disposed on the plate to obtain a carrier state value by communicating with the carrier interface, and a carrier control unit configured to generate carrier management information including the carrier state value obtained through the controller interface and current location information of the carrier and output the carrier management information to a server; and
   a server configured to analyze an internal pollution state of the carrier based on the carrier management information provided by the carrier controller,
   wherein the carrier interface includes an RFID tag and the controller interface includes an RFID reader to perform RFID communication with each other,
   wherein the carrier interface includes a smart sensor configured to generate driving power by being charged with an RF signal received from the controller interface through the RFID tag, record a carrier state value received from the state detecting sensor in another storage area of a sensor memory in which a carrier ID is stored in advance, and output tag information including one or more of the carrier ID or the carrier state value stored in the sensor memory through the RFID tag, and
   wherein the RFID reader is disposed on the plate, outputs an RF signal to the RFID tag of the smart sensor, and reads the tag information by RFID.

2. The automated material handling system of claim 1, wherein the plate is connected to gas supply equipment for supplying and discharging N2 gas into and from the carrier,
   wherein the server generates N2 gas adjustment information based on the degree of pollution in the carrier and transmits the N2 gas adjustment information to a carrier controller of a plate on which the carrier is located, and
   wherein the carrier controller controls the gas supply equipment connected to the plate based on the N2 gas adjustment information received from the server through a carrier control unit to adjust an N2 gas environment in the carrier.

3. The automated material handling system of claim 1, wherein the carrier is formed with a material accommodating portion for accommodating a processing material therein, and the smart sensor is disposed in an empty space inside the carrier in which the processing material accommodating portion is formed and is disposed at a location adjacent to an RFID reader antenna disposed in the plate when the carrier is placed on the plate.

4. The automated material handling system of claim 1, wherein the smart sensor further includes a measurement sensor configured to detect an internal state of the carrier therein and stores a carrier state value measured by the measurement sensor in a preset storage area of the sensor memory.

5. The automated material handling system of claim 1, wherein the smart sensor provides a wireless charging function to the state detecting sensor, and
   wherein the state detecting sensor is configured to operate using power wirelessly charged through the smart sensor and transmit the carrier state value to the smart sensor through wireless communication.

6. The automated material handling system of claim 1, wherein the RFID tag provided in the smart sensor and the RFID reader disposed in the plate perform RFID communication with each other through a tag antenna and a reader antenna, perform data communication and power transmission using a first frequency, and perform power transmission using a second frequency.

7. The automated material handling system of claim 1, wherein the RFID tag and the RFID reader perform RFID communication using a plurality of tag antennas and a plurality of reader antenna in one-to-one correspondence with the plurality of tag antennas,
   wherein a first tag antenna and a first reader antenna perform data communication and power transmission, and
   wherein remaining tag antennas and remaining reader antennas only perform power transmission.

8. The automated material handling system of claim 1, wherein the RFID tag and the RFID reader perform RFID communication using a plurality of tag antennas and a plurality of reader antenna in one-to-one correspondence with the plurality of tag antennas,
wherein a first tag antenna and a first reader antenna perform data communication and power transmission, and
wherein remaining tag antennas and remaining reader antennas only perform power transmission.

9. The automated material handling system of claim 5, wherein the RFID tag and the RFID reader perform RFID communication using a plurality of tag antennas and a plurality of reader antenna in one-to-one correspondence with the plurality of tag antennas,
wherein a first tag antenna and a first reader antenna perform data communication and power transmission, and
wherein remaining tag antennas and remaining reader antennas only perform power transmission.

10. The automated material handling system of claim 1, wherein the carrier controller further includes a carrier detecting sensor disposed on one side of the plate to output a carrier detection signal when the carrier is seated and performs communication with the carrier interface based on a carrier detection signal applied from the carrier detecting sensor.

11. The automated material handling system of claim 1, wherein the carrier controller further includes a carrier detecting sensor disposed on one side of the plate to output a carrier detection signal when the carrier is seated and performs communication with the carrier interface based on a carrier detection signal applied from the carrier detecting sensor.

12. The automated material handling system of claim 1, wherein the server stores carrier management information including a carrier state value and location information based on a carrier ID and determines when to replace a carrier in which pollution of a predetermined degree or more occurs in a predetermined frequency or more and whether to proceed a next process for the carrier using the carrier management information.

13. The automated material handling system of claim 1, wherein the server stores carrier management information including a carrier state value and location information based on a carrier ID and determines when to replace a carrier in which pollution of a predetermined degree or more occurs in a predetermined frequency or more and whether to proceed a next process for the carrier using the carrier management information.

14. The automated material handling system of claim 1, wherein the carrier control unit collects carrier state information from the carrier interface based on reception of N2 gas adjustment information and controls a supply or discharge of N2 gas based on a current state value of the carrier to control an internal pressure of the carrier at an optimal state.

15. The automated material handling system of claim 1, wherein the carrier control unit collects carrier state information from the carrier interface based on reception of N2 gas adjustment information and controls to a supply or discharge of N2 gas based on a current state value of the carrier to control an internal pressure of the carrier at an optimal state.

16. The automated material handling system of claim 1, wherein, when a state detecting sensor is further provided inside the carrier, the server transmits and installs a smart sensor operating program updated to interwork with the added state detecting sensor to each smart sensor through the carrier controller, and the smart sensor communicates with all of the state detecting sensors disposed in the carrier according to the updated smart sensor operating program.

17. The automated material handling system of claim 1, wherein, when a program of the carrier controller is improved, the server transmits and installs an updated carrier controller operating program to the carrier controller, and the carrier controller operates according to the updated carrier controller operating program.

18. The automated material handling system of claim 1, further comprising:
a carrier controller in one-to-one correspondence with the plate,
wherein the carrier controller records a unique ID of the carrier controller in the RFID tag of the smart sensor as carrier location information through the RFID reader, receives the tag information including carrier location information that is carrier movement information until the present time from the RFID tag, and transmits the tag information to the server.

19. The automated material handling system of claim 1, wherein the unmanned transport vehicle includes a controller interface for communicating with the carrier interface disposed in the carrier which is being accommodated and moved,
wherein the unmanned transport vehicle generates carrier management information by adding its own unique ID as carrier location information to the tag information received through the controller interface and transmits the carrier management information to the server.

20. The automated material handling system of claim 1, wherein the unmanned transport vehicle includes a controller interface for communicating with the carrier interface disposed in the carrier which is being accommodated and moved,
wherein the unmanned transport vehicle generates carrier management information by adding its own unique ID as carrier location information to the tag information received through the controller interface and transmits the carrier management information to the server.

21. The automated material handling system of claim 1, wherein a carrier control module of the carrier controller is connected to a plurality of plates to generate carrier management information including state information and carrier location information for each carrier seated on each plate and transmit the carrier management information to the server, and the carrier location information is a unique ID of a corresponding plate.

22. The automated material handling system of claim 1, wherein a carrier control module of the carrier controller is connected to a plurality of plates to generate carrier management information including state information and carrier location information for each carrier seated on each plate and transmit the carrier management information to the server, and the carrier location information is a unique ID of a corresponding plate.

* * * * *